(12) United States Patent
Cork et al.

(10) Patent No.: US 8,283,927 B2
(45) Date of Patent: Oct. 9, 2012

(54) AMPLIFIER

(75) Inventors: Peter Cork, Romsey (GB); Sebastian Martius, Forchheim (DE); Markus Vester, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 504 days.

(21) Appl. No.: 12/612,831

(22) Filed: Nov. 5, 2009

(65) Prior Publication Data
US 2010/0117650 A1    May 13, 2010

(30) Foreign Application Priority Data

Nov. 12, 2008 (GB) .................................. 0820692.2
Mar. 5, 2009 (GB) .................................. 0903722.7

(51) Int. Cl.
*G01V 3/00* (2006.01)
(52) U.S. Cl. ........................................ 324/322; 324/318
(58) Field of Classification Search .................. 324/322, 324/318, 314, 311, 300
See application file for complete search history.

(56) References Cited

U.S. PATENT DOCUMENTS

| | | | |
|---|---|---|---|
| 3,218,564 A * | 11/1965 | Seidel | 330/4.8 |
| 3,591,848 A | 7/1971 | Otto | |
| 3,710,268 A | 1/1973 | Neuf | |
| 3,833,857 A | 9/1974 | Fletcher et al. | |
| 4,131,858 A | 12/1978 | Niehenke et al. | |
| 7,417,433 B2 | 8/2008 | Heid et al. | |
| 8,138,761 B2 * | 3/2012 | Evans | 324/318 |
| 2010/0253345 A1 * | 10/2010 | Vester | 324/316 |
| 2010/0253346 A1 * | 10/2010 | Hulbert | 324/316 |
| 2010/0253349 A1 * | 10/2010 | Cork et al. | 324/318 |
| 2010/0253352 A1 * | 10/2010 | Hulbert | 324/318 |
| 2010/0253353 A1 * | 10/2010 | Cork et al. | 324/318 |
| 2011/0059716 A1 * | 3/2011 | Cork | 455/330 |

* cited by examiner

*Primary Examiner* — Louis Arana
(74) *Attorney, Agent, or Firm* — Schiff Hardin LLP

(57) ABSTRACT

A two port parametric amplifier has a first port that receives an input signal to be amplified and upconverted and a second port that receives a local oscillator signal. The amplified upconverted input signal is emitted as an output at upper and lower sideband frequencies. The amplifier further has a pair of varactor diodes connected between the first port and the second port. The diodes are connected in parallel from the first port and in series from the second port.

12 Claims, 2 Drawing Sheets

AMPLIFIER

BACKGROUND OF THE INVENTION

1. Related Applications

This application is related to the subject matter of the following applications filed simultaneously herewith; Ser. No. 12/612,842 now issued as U.S. Pat. No. 8,138,761, Ser. No. 12,612,856, Ser. No. 12/613,004 now issued as U.S. Pat. No. 8,129,992, Ser. No. 12/613,033 now issued as U.S. Pat. No. 8,030,931, and Ser. No. 12/613,082.

2. Field of the Invention

This invention relates to a two port parametric amplifier, in particular for use in magnetic resonance imaging (MRI) systems.

3. Description of the Prior Art

MRI scanners use a combination of a strong constant magnetic field (B0) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the $B_1$ field and with the signals generated from the patient so 'traps' (high impedance sections) must be included at regular (typically $\lambda/8$) intervals. These add cost and inconvenience to the structure.

In use, the requirement to connect the cables and sterilize them between scanning one patient and the next leads to down-time between scans. Elimination of these cables is therefore desirable.

SUMMARY OF THE INVENTION

In accordance with a first aspect of the present invention, a two port parametric amplifier has a first port to receive an input signal to be amplified and upconverted and a second port to receive a local oscillator signal and to output the amplified upconverted input signal, at upper and lower sideband frequencies, and the amplifier further has a pair of varactor diodes connected between the first port and the second port. The diodes are connected in parallel from the first port and in series from the second port.

The present invention uses a two port parametric amplifier, with only two ports providing all three of signal input, local oscillator input and upconverted signal output.

Preferably, the amplifier further has a pair of shunt lines with a central ground connection.

Preferably, the ground connection provides a ground return for an input signal received at the first port.

Preferably, the amplifier further has a dipole antenna.

Preferably, matching feed lines are provided between the varactor diodes and the second port.

Preferably, the first port further has a matching impedance.

Preferably, the first port further has a high resistance bias feed.

Preferably, the first port is an RF port, which receives signals in the frequency range 20 MHz to 500 MHz.

Preferably, the second port is a microwave port which receives signals in the frequency range 1 GHz to 5 GHz.

In accordance with a second aspect of the present invention, a wireless magnetic resonance imaging system has a local oscillator and transceiver array mounted in a bore of the system and a wireless local coil array and upconversion stage having a number of amplifiers according to the first aspect.

The present invention is part of a system that enables a wireless implementation of the patient coils. Ideally, the wireless solution substantially satisfies all the requirements of the existing wired system, maintaining in particular the low noise figure and also the dynamic range.

DESCRIPTION OF THE PREFERRED EMBODIMENTS

The wireless concept to which the features of the present invention apply is based on upconversion, in the patient mat, of the RF (Larmor) frequency signals from the patient coils to microwave frequencies for transmission to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from a plurality of patient antennas to be resolved. The present invention relates to the amplifiers that implement the upconversion process.

Figure 1:
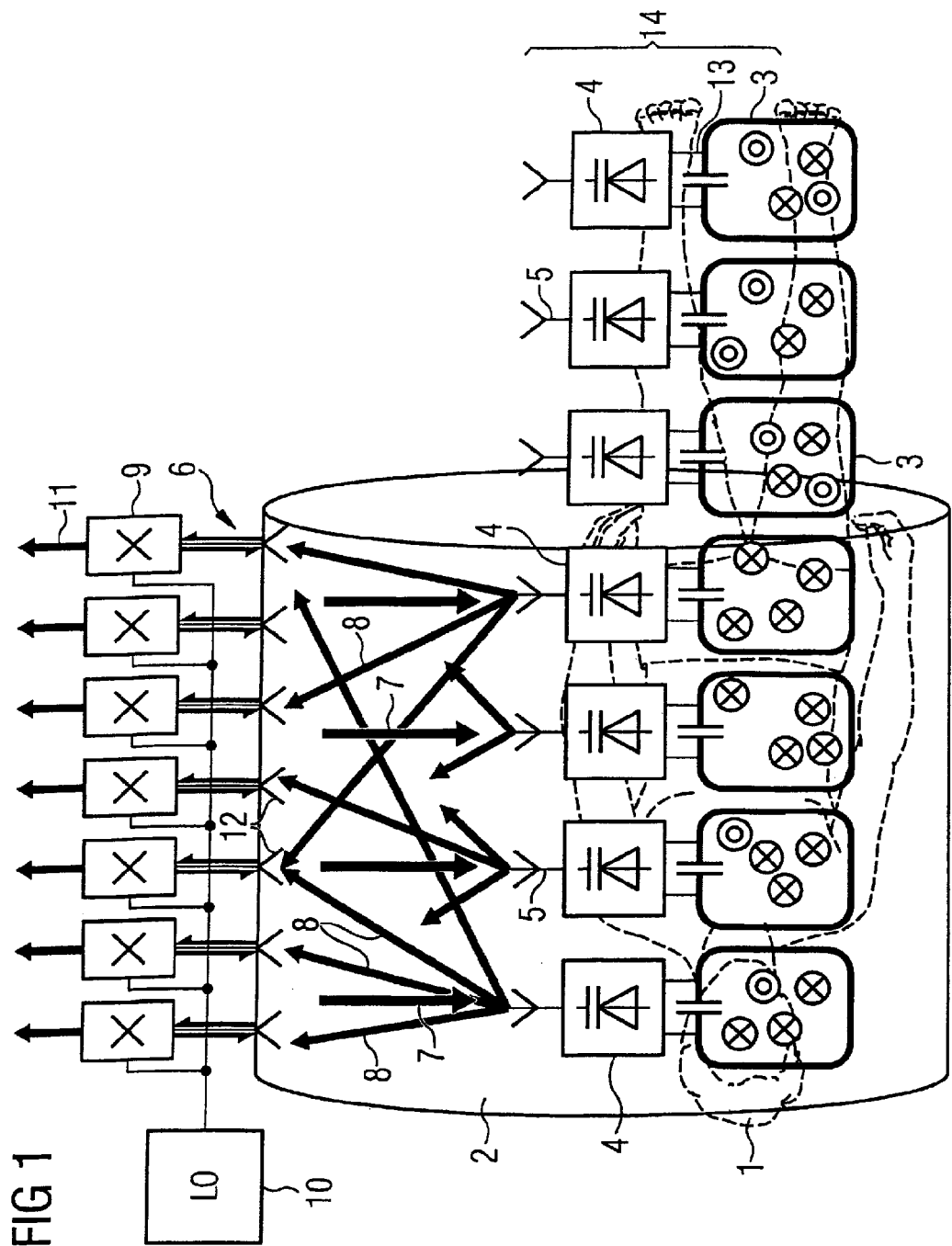
FIG. 1 illustrates an example of an MRI system incorporating amplifiers according to the present invention.

An example of an MRI system using a MIMO microwave link, in which amplifiers in accordance with the present invention are used, will now be described. FIG. 1 shows a patient 1 within an MRI scanner bore tube 2. A mat covers the patient and embedded in the mat are a plurality of local coils 3. Associated with each local coil 3 is an upconverter stage 4 and microwave antenna 5. Transceivers 9, connected to an array 6 of antennas 12, are integrated into the scanner bore 2. The frequency upconverter 4 for each patient mat coil 3 produces signals for transmission to the array of transceivers in the scanner bore 2. A local oscillator (LO) signal at around 2.4 GHz, or other chosen microwave frequency, feeds the antenna array 6 to illuminate the patient coil electronics 14 with a signal 7 at the local oscillator frequency. Parametric amplifiers in the upconverter stage 4 use the incident local oscillator signal 7 to provide a frequency reference and power for upconversion. Magnetic resonance (MR) signals 13 from the coils are thereby converted to microwave frequency signals and transmitted to the bore transceiver antenna array 6. The same local oscillator signal in the transceivers converts the upconverted signals 8, received from the patient coils 3 at the LO frequency ±63 MHz, back to the original MR frequency of 63 MHz for input 11 to MR receivers in an image processing system (not shown.) The Larmor frequency $\omega_0$ is dependent upon the gyromagnetic ratio $\gamma$ and the magnetic field strength $B_0$, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

The present invention uses a parametric amplifier circuit to carry out the mixing and amplification necessary for upconversion 4 of a radio frequency signal 13 received from each of the local coils 3. The parametric amplifier is a two port parametric amplifier, in which a first port 21 receives an input signal to be upconverted and transmitted from the second port 34 and the second port also receives a local oscillator signal for use in the upconversion.

Figure 2:
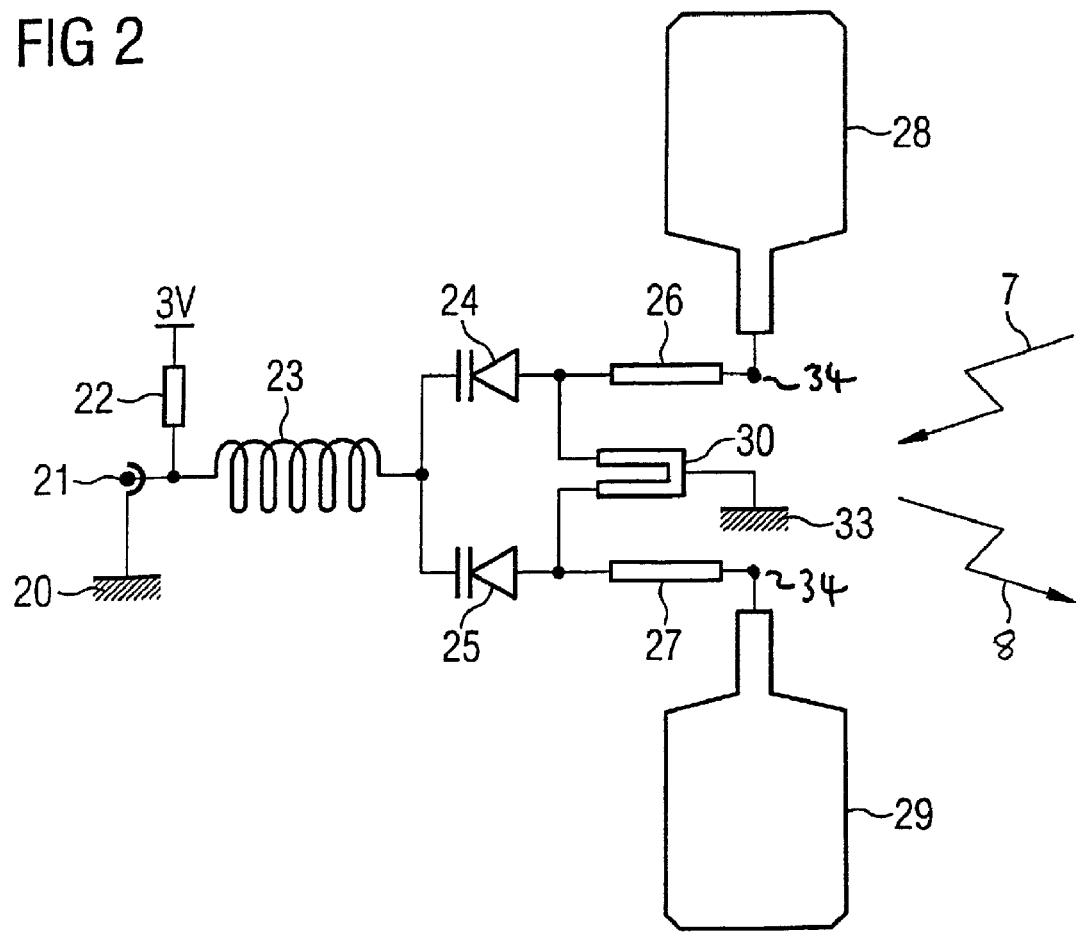
FIG. 2 illustrates in more detail, an example of an amplifier according to the present invention, for use in the system of FIG. 1.

The parametric amplifier is shown in more detail in FIG. 2. The example of FIG. 2 comprises a parametric amplifier core provided with a single ended RF input 21 to receive the MR signal 13 from the local coil. A bias voltage 22 and an earth 20 are provided at the input and a microwave port 34 at the output is connected to dipole antennas 28, 29. In this example, the magnetic resonance signal is at 63.6 MHz. The RF signal 13 is fed via a high Q RF input inductor 23 to drive the varactor diode pair 24, 25 in common mode parallel with 'earth return' via the shunt matching line pair 30 to ground connection 33. A high impedance (very low current requirement) voltage source provides bias voltage 22 at e.g. 3V via the high Q RF input matching choke 23 to the varactor diode pair 24, 25 (e.g. BBY53-02V) to set the correct operational capacitance bias point. Incident local oscillator 'pump' signal 7 (at a frequency for example of 2.44 GHz) received by the microwave antenna 28, 29 is input to the microwave port and fed via the appropriate printed microwave series matching lines 26, 27 and shunt matching lines 30 to provide differential drive (with centre ground 33) to the varactor diode pair 24, 25. This differential LO signal 7 mixes with the common mode RF drive signal 13 in the varactor diodes 24, 25 to produce microwave frequency lower side band (LSB) and upper side band (USB) products. These differential mode mixing products are fed back through the microwave matching lines 26, 27 and microwave port 34 to the microwave antenna 28, 29 for transmission back to the bore array of transceivers.

The two varactor diodes 24, 25 of the parametric amplifier circuit serve as an upconverter and an amplifier that requires no DC power supply, using directly the 'pump' signal 7 as a local oscillator and source of power. Parametric amplifiers are typically two port devices where a first port receives an input signal at a relatively low frequency to be upconverted and amplified and a second port both receives the pump signal at a relatively high frequency and outputs the relatively high frequency upconverted and amplified mixing product. Circulators are commonly used to separate the upconverted output signals from the incident LO drive signals, but these ferromagnetic based devices are not suitable for MRI applications because of the B0 field. Instead, re-radiated LSB/USB signals are separated from the incident LO in filters in the bore transceivers.

For the example of the present invention, it is desirable that the pump signal 7 to the parametric amplifier core should be received from an over-the-air transmission in order to remove any requirement for a DC power supply to the mat. The total bandwidth occupied by the upper and lower sidebands and the pump signal 7 is typically small enough to fall within the efficient bandwidth of a single antenna. Thus, the present invention provides a two port parametric amplifier circuit, such that the first port 21 receives the input signal 13 to be upconverted and amplified and the second port 34 receives the pump signal 7 and also outputs the upconverted and amplified input signal 8 at the upper and lower sideband frequencies.

The local oscillator signal 7 received by the dipole antenna 28, 29 from the bore array transmitters 9 arrives at the microwave port 34 at a power level of +10 dBm. This 'pump' signal is fed via the printed line matching 26, 27 to the varactor diode pair 24, 25. The common cathode configuration of the varactor diodes, with the anodes connected one to each half of the balanced feed from the dipole antenna 28, 29, results in antiphase stimulation of the varactor diodes at the LO (pump) frequency. RF stimulation via the RF input inductor 23 at the common cathode node leads to in-phase stimulation of the varactor diodes 24, 25 at the RF frequency. The resulting LSB and USB signals generated in each of the two varactor diodes are therefore in anti-phase. These wanted output signals, along with the greater (reflected) part of the incident LO signal 7, are then conveyed via the printed line matching 26, 27 back to the microwave port 34 and the dipole antenna 28, 29 where the signals 8 are broadcast into the bore 2 for reception by the bore receiver array system 6, 9, 10.

The high Q RF input matching choke 23 in series with the single ended RF input 21 is series resonant with the high capacitive reactance of the varactor diodes 24, 25 at the RF frequency. The earth return for the RF feed 21 is provided by the centre grounding 33 of the microwave port shunt line 30. The center-grounded shunt microstrip line in the microwave port resonates with the greater part of the high capacitive admittance of the varactor diodes 24, 25 at the microwave port frequency. The balanced pair of series lines 26, 27 then tunes out the remainder of the capacitive reactance of the varactor diodes and completes the impedance transformation to match to the 22Ω balanced load of the microwave dipole antenna 28, 29.

In this implementation of the present invention, the diodes are connected in parallel for the RF feed, to halve the high impedance of the varactor diodes at 63.6 MHz RF for presentation at the RF port. The diodes are connected in series for the microwave port to double the very low impedance of the varactor diodes at 2.442 GHz for presentation at the microwave port. The series/parallel configuration lends itself to single ended RF drive, balanced microwave drive and two port operation. A single ended RF drive is appropriate at 63.6 MHz and is effected by means of drive through the RF input choke 23 and ground return 33 at the microwave port voltage node. A balanced microwave port is appropriate at 2.44 GHz for connection to a dipole antenna.

The microwave port operates fully balanced for LO "pump" feed at 2.442 GHz as well as for the output frequencies at 2.442 GHz±63.6 MHz. This obviates the need for any low impedance grounding in the microwave port circuits. Operation of the microwave port fully balanced suits perfectly connection to the balanced dipole antenna 28, 29 for reception of the LO signal 7 and re-radiation of the LSB and USB signals 8.

The design of this implementation is configured to allow high, in fact potentially infinite, "4-frequency" gain. This is a re-generative condition whereby RF frequency power that is produced in the generation of the LSB signal cancels with incident RF from the signal source to result in a reduced level of absorbed RF power for a given output and hence an increased gain. The correct power balance to achieve a controlled fixed gain is dependant on the precise tuning of the microwave port 34, which in turn is dependant on the bias voltage applied to the varactor diodes 24, 25, so uses a system for precise control of the bias voltage to achieve this control, and in addition to compensate for the dependence of the microwave port tuning on LO drive level In summary, in the present invention, local coil upconverters based on parametric amplifiers perform the upconversion of the local coil signals from the Larmor frequency to microwave frequencies, implementing low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

Although modifications and changes may be suggested by those skilled in the art, it is the intention of the inventors to embody within the patent warranted hereon all changes and modifications as reasonably and properly come within the scope of their contribution to the art.

We claim as our invention:

1. A two-port parametric amplifier, comprising:
   a first port supplied with an input signal to be amplified and upconverted;
   a second port that receives a local oscillator signal;
   said second port also forming an output at which the amplified and upconverted input signal is emitted as an output at upper and lower side band frequencies; and
   amplifier circuitry comprising two varactor diodes connected between said first port and said second port, said varactor diodes being connected in parallel from said first port and being connected in series from said second port.

2. An amplifier as claimed in claim 1 comprising two shunt lines respectively connected to said varactor diodes, with a central ground connection.

3. An amplifier as claimed in claim 2 wherein said ground connection forms a ground return for the input signal at said first port.

4. An amplifier as claimed in claim 1 comprising a dipole antenna connected to said first port.

5. An amplifier as claimed in claim 4 comprising matching feed lines between said varactor diodes and said second port.

6. An amplifier as claimed in claim 1 comprising a matching impedance for said input signal at said first port.

7. An amplifier as claimed in claim 1 comprising a high resistance bias feed to said varactor diodes.

8. An amplifier as claimed in claim 1 wherein said first port is an RF port.

9. An amplifier as claimed in claim 8 wherein said first port is configured to receive said input signal in a frequency range between 20 MHz and 500 MHz.

10. An amplifier as claimed in claim 1 wherein said second port is a microwave port.

11. An amplifier as claimed in claim 10 wherein said second port is configured to receive a local oscillator signal in a frequency range between 1 GHz and 5 GHz.

12. A magnetic resonance imaging system comprising:
    a magnetic resonance data acquisition unit comprising a local oscillator and a transceiver array mounted in a bore of said magnetic resonance data acquisition unit, and local coils that detect and emit magnetic resonance signals;
    a wireless array that wirelessly amplifies and upconverts said magnetic resonance signals, said wireless array comprising a plurality of amplifiers; and
    each of said amplifiers comprising a first port supplied with one of said magnetic resonance signals as an input signal to be amplified and upconverted, amplifier circuitry, connected to said first port, that produces an amplified and upconverted signal from said input signal, a second port, connected to said amplifier circuitry, that receives a local oscillator signal and at which the amplified and upconverted input signal is emitted as an output at upper and lower side band frequencies, and amplifier circuitry comprising two varactor diodes connected between said first port and said second port, said varactor diodes being connected in parallel from said first port and being connected in series from said second port.

* * * * *